(12) United States Patent
Wyland

(10) Patent No.: US 6,778,398 B2
(45) Date of Patent: Aug. 17, 2004

(54) THERMAL-CONDUCTIVE SUBSTRATE PACKAGE

(75) Inventor: Chris Wyland, Livermore, CA (US)

(73) Assignee: Koninklijke Philips Electronics N.V., Eindhoven (NL)

(*) Notice: Subject to any disclaimer, the term of this patent is extended or adjusted under 35 U.S.C. 154(b) by 27 days.

(21) Appl. No.: 10/279,703

(22) Filed: Oct. 24, 2002

(65) Prior Publication Data

US 2004/0080915 A1 Apr. 29, 2004

(51) Int. Cl.[7] ................................................. H05H 7/20
(52) U.S. Cl. ..................... 361/720; 174/252; 361/713; 361/707; 361/706; 428/901
(58) Field of Search ............................. 165/80.2, 80.3, 165/185; 257/706–707, 712–713, 717, 228; 174/252, 260; 361/704–722; 428/901

(56) References Cited

U.S. PATENT DOCUMENTS

| | | | | |
|---|---|---|---|---|
| 3,694,699 A | * | 9/1972 | Snyder et al. ............... 361/705 |
| 4,675,784 A | * | 6/1987 | Dahlberg et al. ............ 361/720 |
| 5,309,321 A | | 5/1994 | Olla et al. | |
| 5,500,555 A | | 3/1996 | Ley | |
| 5,687,062 A | * | 11/1997 | Larson ........................ 361/706 |
| 5,929,375 A | * | 7/1999 | Glovatsky et al. ......... 174/35 R |
| 5,960,863 A | | 10/1999 | Hua | |
| 6,121,680 A | | 9/2000 | Chiu et al. | |

* cited by examiner

Primary Examiner—Gregory D. Thompson
(74) Attorney, Agent, or Firm—Peter Zawilski

(57) ABSTRACT

A substrate material for mounting an integrated circuit contains a non-electrically-conductive mesh of thermally-conductive material. Because the mesh is electrically-non-conductive, it can purposely be configured to contact any and all of the circuit traces that are proximate to the substrate, thereby using the circuit traces as thermally-coupled heat sinks. In a preferred embodiment, the thermally-conductive mesh replaces the structural fiberglass mesh that is conventionally used in substrates, thereby allowing the mesh to serve a dual structural and thermal function.

11 Claims, 1 Drawing Sheet

THERMAL-CONDUCTIVE SUBSTRATE PACKAGE

BACKGROUND OF THE INVENTION

1. Field of the Invention

This invention relates to the field of integrated circuit packaging, and in particular to a substrate that provides efficient thermal conductivity.

2. Description of Related Art

High-current-drawing circuits produce heat that must be dissipated. U.S. Pat. No. 6,121,680 discloses the use of a heat-fin structure that is affixed to the top of an integrated circuit to dissipate heat from the integrated circuit to the air around the fins of the heat-fin structure. U.S. Pat. No. 5,960,863 teaches the use of a dissipating block consisting of several overlapping screen plates that is bolted to a thermally conductive base plate that is fastened to the integrated circuit from which the heat is dissipated.

U.S. Pat. No. 5,309,321 teaches a wire mesh that is encapsulated into a non-electrically conductive thermosetting or thermoplastic material that forms a housing that encloses an integrated circuit chip. U.S. Pat. No. 5,500,555 teaches a substrate for mounting an integrated circuit chip that comprises a sandwich of insulating prepeg material and a thermally conductive mesh or screen.

Each of the prior art embodiments rely upon a layer of insulating material that separates the thermally-conductive material from conductors of the integrated circuit, or from conductors of the printed circuit board upon which the integrated circuit device is mounted. Each of these prior art embodiments requires one or more processing steps to create the multilayer (conductor, non-conductor) structure that dissipates heat from the integrated circuit. Additionally, in each of the prior art embodiments, a separate heat-dissipation structure is used to dissipate the heat produced by the integrated circuit.

BRIEF SUMMARY OF THE INVENTION

It is an object of this invention to provide a cost-effective means to dissipate heat from a circuit, such as an integrated circuit chip. It is a further object of this invention to provide a heat dissipation device that allows the dissipation of heat from a circuit to multiple traces on a printed-circuit board. It is a further object of this invention to provide a heat dissipation device that minimizes the risk of short circuits caused by the thermally conductive material in the heat dissipation device.

These objects, and others, are achieved by providing a substrate material that contains a non-electrically-conductive mesh of thermally-conductive material. Because the mesh is electrically-non-conductive, it can purposely be configured to contact any and all of the circuit traces that are proximate to the substrate, thereby using the circuit traces as thermally-coupled heat sinks. In a preferred embodiment, the thermally-conductive mesh replaces the structural fiberglass mesh that is conventionally used in substrates, thereby allowing the mesh to serve a dual structural and thermal function.

BRIEF DESCRIPTION OF THE DRAWINGS

The invention is explained in further detail, and by way of example, with reference to the accompanying drawings wherein.

DETAILED DESCRIPTION OF THE INVENTION

Figure 1:
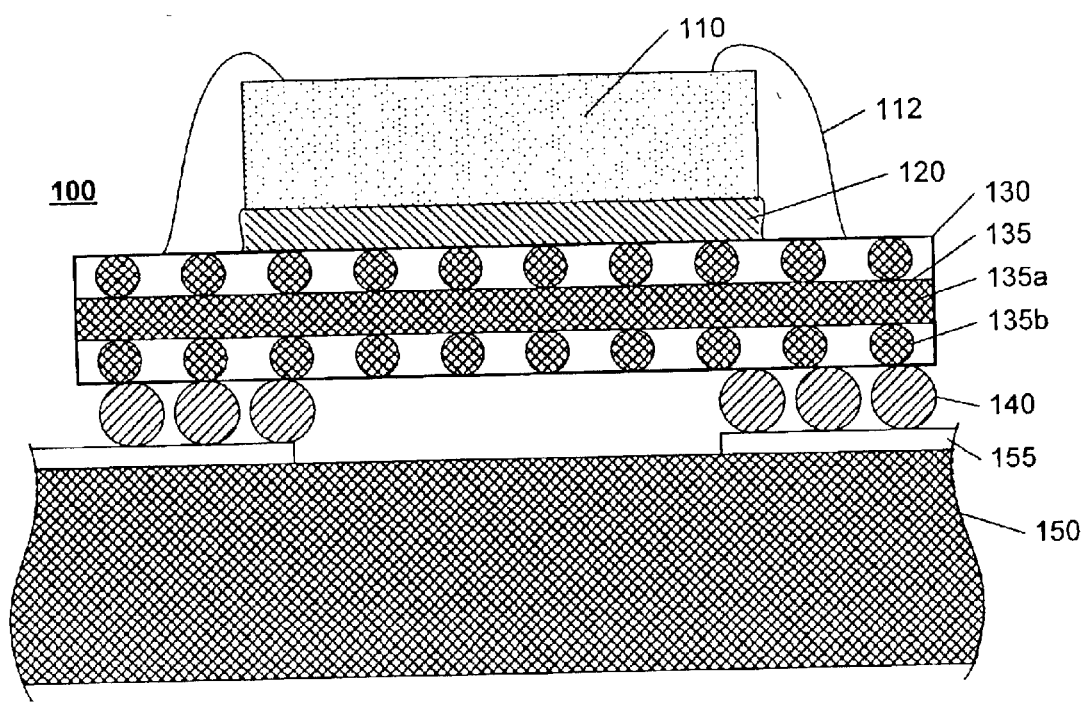
FIG. 1 illustrates an example integrated circuit device with a thermally-conductive substrate in accordance with this invention.

The invention is presented herein using the paradigm of a substrate that is used to mount an integrated circuit chip, and, specifically to a substrate that is used for hosting an integrated circuit chip in a ball-grid array. As will be evident to one of ordinary skill in the art, the principles of this invention are applicable to other structures that use a substrate, or other techniques for attaching the substrate to another structure. In like manner, although the invention is particularly well suited for a substrate that is placed in contact with a larger heat sink, the substrate itself may form the entirety of the heat sink, depending upon the amount of heat that is to be dissipated.

FIG. 1 illustrates an example integrated circuit device 100 with a thermally-conductive substrate 130. An integrated circuit 110 is attached to the substrate 130 via a die attach compound 120 that effects a thermal coupling between the integrated circuit 110 and the substrate 130. Electrical conductivity between the integrated circuit 110 and traces 155 on a printed circuit board 150 is effected via bonding wires 112, "vias" through the substrate (not illustrated), and solder balls 140.

In accordance with this invention, the substrate 130 includes a thermally-conductive, but not electrically-conductive, mesh or grid 135, as illustrated by the alternating layers 135a, 135b. Examples of a thermally-conductive but not electrically-conductive grid include zinc-oxide, tungsten-oxide, or anodized aluminum grids. The basic material is formed into a wire, then oxidized to form an integral non-conductive surface on the wire, then woven into a mesh or grid. Alternatively, the basic material can be formed or stamped into a grid pattern, then oxidized or otherwise processed to form an integral non-conductive surface. Also alternatively, the non-electrically-conductive material can be formed, stamped, or woven into a mesh or grid pattern, although the weaving of an oxidized material may be impractical.

In a preferred embodiment of this invention, the mesh 135 replaces the fiberglass mesh that is used in conventional substrates. The use of zinc-oxide or tungsten-oxide grids provides advantages over the fiberglass mesh. In addition to providing a substantially higher thermal-conductivity than fiberglass, zinc provides a thermal-expansion-coefficient that is closer to epoxy and copper than fiberglass, thereby reducing thermal stress between the substrate 130 and the traces 155 on the printed circuit board 150. Alternatively, tungsten provides thermal-expansion-coefficient that is closer to that of silicon than copper, thereby reducing thermal stress between the substrate 130 and the integrated circuit 110, as well as providing a substantially higher thermal-conductivity than fiberglass.

In a preferred embodiment, the vias (not illustrated) and grid 135 are designed such that the via locations correspond to the gaps in the grid 135, to avoid piercing the oxide insulation of the grid 135 at the via location. Alternatively, the oxidation of the grid/mesh 135 can occur after the holes for the vias are created in the substrate, thereby insulating the exposed upper and lower layers of the grid/mesh 135, as well as any exposed metal within each via hole.

As contrast to the prior art, which use one or more discrete layers of insulating material between the integrated circuit 110 or printed-circuit board 150 and the prior-art thermal-conductive layers, the invention of this disclosure provides a higher degree of thermal-coupling. Because the thermal-conductive layers 135 of this invention are electrically-nonconductive, these layers can extend to the surface of the substrate 130, for direct, or near-direct contact with the heat-generating device 110 and/or with a heat-sinking structure 150. For example, as contrast to U.S. Pat. No. 5,500,555, which uses a layer of prepeg material to insulate a copper thermal-conductive layer, the thermal conductivity of zinc-oxide or tungsten-oxide is substantially higher than that of prepeg material.

The foregoing merely illustrates the principles of the invention. It will thus be appreciated that those skilled in the art will be able to devise various arrangements which, although not explicitly described or shown herein, embody the principles of the invention and are thus within the spirit and scope of the following claims.

I claim:

1. An integrated circuit device comprising:

an integrated circuit and a substrate for mounting the integrated circuit;

wherein the substrate comprises at least one layer of thermally-conductive and electrically-non-conductive material that is configured to conduct heat from the integrated circuit;

a plurality of contacts that are configured to provide an electrical coupling of the integrated circuit to a plurality of traces on a printed circuit board; and wherein a layer of the at least one layer of thermally-conductive and electrically-non-conductive material is configured to provide a thermal coupling of the integrated circuit to the plurality of traces on the printed circuit board.

2. The integrated circuit device of claim 1, wherein the plurality of contacts includes a ball-grid array of contacts.

3. The integrated circuit device of claim 1, wherein the thermally-conductive and electrically-non-conductive material includes at least one of:

a zinc-oxide material, a tungsten-oxide material, and an anodized aluminum material.

4. The intergrated circuit device of claim 1, wherein a layer of the at least one layer of thermally-conductive and electrically-non-conductive material comprises a surface of the substrates.

5. The integrated circuit device of claim 1, wherein:

the at least one layer of thermally-conductive and electrically-non-conductive material comprises a plurality of adjacent layers of thermally-conductive and electrically-non-conductive material, and a first layer and a last layer of the plurality of adjacent layers form a first surface and a second surface of the substrate, thereby providing thermal conduction from the integrated circuit at the first surface to a heat-sinking structure at the second surface of the substrate.

6. A substrate for supporting an electronic circuit comprising:

at least one layer of thermally-conductive and electrically-non-conductive material that is configured to conduct heat from the electronic circuit, wherein, a layer of the at least one layer of thermally-conductive and electrically-non-conductive material is configured to provide a thermal coupling of the electronic circuit to a plurality of traces on a printed circuit board.

7. The substrate of claim 6, wherein the thermally-conductive and electrically-non-conductive material includes at least one of:

a zinc-oxide material, a tungsten-oxide material, and an anodized aluminum material.

8. The substrate of claim 6, wherein a layer of the at least one layer of thermally-conductive and electrically-non-conductive material comprises a surface of the substrate.

9. The substrate of claim 6, wherein:

the at least one layer of thermally-conductive and electrically-non-conductive material comprises a plurality of adjacent layers of thermally-conductive and electrically-non-conductive material, and a first layer and a last layer of the plurality of adjacent layers form a first surface and a second surface of the substrate, thereby providing thermal conductive from the integrated circuit at the first surface to a heat-sinking structure at the second surface of the substrate.

10. A method of facilitating thermal coupling of an integrated circuit to a heat-sink, comprising:

providing a substrate that includes at least one layer of thermally-conductive and electrically-non-conductive material that is configured to conduct heat from the integrated circuit, and mounting the integrated circuit upon the substrate, such that the integrated circuit is in thermal contact with the at least one layer; and a plurality of contacts that are configured to provide an electrical coupling of the integrated circuit to the plurality of traces on the printed circuit board; and wherein an other layer of the at least one layer of thermally-conductive and electrically-non-conductive material is configured to provide a thermal coupling of the integrated circuit to the plurality of traces on the printed circuit board.

11. The method of claim 10 wherein the thermally-conductive and electrically-non-conductive material includes at least one of:

a zinc-oxide material, a tungsten-oxide material, and an anodized aluminum material.

* * * * *